(12) United States Patent
Liu

(10) Patent No.: US 11,744,162 B2
(45) Date of Patent: Aug. 29, 2023

(54) TOPOLOGICAL SPIN TEXTURES IN 3-DIMENSIONAL MAGNETIC STRUCTURES

(71) Applicant: THE REGENTS OF THE UNIVERSITY OF CALIFORNIA, Oakland, CA (US)

(72) Inventor: Kai Liu, Falls Church, VA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 83 days.

(21) Appl. No.: 17/470,856

(22) Filed: Sep. 9, 2021

(65) Prior Publication Data

US 2021/0408369 A1 Dec. 30, 2021

Related U.S. Application Data

(60) Division of application No. 16/752,251, filed on Jan. 24, 2020, now Pat. No. 11,145,805, which is a (Continued)

(51) Int. Cl.
*H10N 50/80* (2023.01)
*G11C 11/16* (2006.01)
(Continued)

(52) U.S. Cl.
CPC ........... *H10N 50/80* (2023.02); *G11C 11/161* (2013.01); *G11C 11/1673* (2013.01);
(Continued)

(58) Field of Classification Search
CPC ....... H01L 43/02; H01L 27/222; H01L 43/12; H01L 43/10; G11C 11/161; G11C 11/1673; H10N 50/80; H10N 50/01; H10B 61/00
(Continued)

(56) References Cited

U.S. PATENT DOCUMENTS 9,653,136 B2    5/2017  Cros et al.
11,065,520 B1 * 7/2021  Nguyen ................. A63B 67/10
(Continued)

FOREIGN PATENT DOCUMENTS

EP      3028279 A1   6/2016
JP      2012232324   11/2012
(Continued)

OTHER PUBLICATIONS

ISA/U.S. International Search Report and Written Opinion dated Dec. 6, 2018, related PCT international application No. PCT/US2018/044286, pp. 1-10, claims searched, pp. 11-15.
(Continued)

*Primary Examiner* — Jami Valentine Miller
(74) *Attorney, Agent, or Firm* — Park, Vaughan, Fleming & Dowler LLP

(57) ABSTRACT

Utilizing the topological character of patterns in 3D structures is beneficial for information storage, magnetic memory and logic systems. One embodiment describes the use of topological knots, exemplified by a Möbius strip, in which a spin traversing along the band for a complete cycle will recover its original position, while having rotated away from its original orientation. The spins can respond to an external magnetic field, but cannot achieve a ferromagnetic state, in which all magnetic moments are pointing in the same direction, due to the topological knot. 3D assemblies of such nano-Möbius strips may form prototype secure magnetic information storage devices that are secure and with extremely low levels of energy dissipation.

19 Claims, 2 Drawing Sheets

Related U.S. Application Data continuation of application No. PCT/US2018/044286, filed on Jul. 30, 2018.

(60) Provisional application No. 62/539,898, filed on Aug. 1, 2017.

(51) Int. Cl.
  H10B 61/00 (2023.01)
  H10N 50/01 (2023.01)
  H10N 50/85 (2023.01)

(52) U.S. Cl.
  CPC ............ H10B 61/00 (2023.02); H10N 50/01 (2023.02); H10N 50/85 (2023.02)

(58) Field of Classification Search
  USPC ........................................................ 257/421
  See application file for complete search history.

(56) References Cited

U.S. PATENT DOCUMENTS

| | | | |
|---|---|---|---|
| 2005/0154567 A1 | 7/2005 | Jackman et al. | |
| 2006/0262876 A1* | 11/2006 | LaDue | H04B 17/309 |
| | | | 375/295 |
| 2009/0112564 A1* | 4/2009 | Schmieder | G06F 30/3323 |
| | | | 703/21 |
| 2010/0328799 A1 | 12/2010 | Braganca et al. | |
| 2011/0186947 A1* | 8/2011 | Liu | B82Y 10/00 |
| | | | 428/116 |
| 2011/0192233 A1 | 8/2011 | Aizenberg et al. | |
| 2012/0075682 A1* | 3/2012 | Amoroso | G06N 10/00 |
| | | | 977/933 |
| 2012/0141966 A1* | 6/2012 | Heyring | H02N 99/00 |
| | | | 434/301 |
| 2016/0314827 A1* | 10/2016 | Cros | G11C 11/18 |
| 2017/0050363 A1* | 2/2017 | Williams | B22F 10/366 |

FOREIGN PATENT DOCUMENTS

| | | |
|---|---|---|
| JP | 2013045860 | 3/2013 |
| JP | 2013045860 A | 3/2013 |
| JP | 2014086470 A | 5/2014 |
| WO | 2015015007 A1 | 2/2015 |
| WO | 2015146827 A1 | 10/2015 |
| WO | 2019027862 A1 | 2/2019 |

OTHER PUBLICATIONS

Jiang, Wanjun et al., "Skyrmions in Magnetic Multilayers", Physics Reports, vol. 704, Aug. 23, 2017, pp. 1-49.

Liu, Yong-Kai et al., "3D skyrmion and knot in two-component Bose-Einstein condensates", Physics Letters A 377 (2013) 3300-3303, published online Oct. 23, 2013.

Streubel, Robert et al., "Manipulating Topological States by Imprinting Non-Collinear Spin Textures", Scientific Reports, 5:8787, publshed Mar. 5, 2015, pp. 1-7.

* cited by examiner

TOPOLOGICAL SPIN TEXTURES IN 3-DIMENSIONAL MAGNETIC STRUCTURES

CROSS-REFERENCE TO RELATED APPLICATIONS

This application is a divisional of U.S. patent application Ser. No. 16/752,251, which was filed Jan. 24, 2020 (the '251 application). The '251 application claims priority to, and is a 35 U.S.C. § 111(a) continuation of, PCT international application number PCT/US2018/044286, which was filed Jul. 30, 2018 (the PCT application). The PCT application claims priority to, and the benefit of, U.S. Provisional Patent Application No. 62/539,898 which was filed Aug. 1, 2017. Priority is claimed to each of the foregoing applications, and each of the foregoing applications is incorporated herein by reference in its entirety.

The above-referenced PCT international application was published as PCT International Publication No. WO 2019/027862 A1 on Feb. 7, 2019, which publication is incorporated herein by reference in its entirety.

STATEMENT REGARDING FEDERALLY SPONSORED RESEARCH OR DEVELOPMENT

This invention was made with Government support under Grant No. DMR1543582, awarded by the National Science Foundation. The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to magnetic information storage systems, and more particularly to using 3D topological spin textures in magnetic storage, memory and logic systems.

2. Background Discussion

Magnetic nanostructures with topological characters, such as magnetic skyrmions, may hold the key to the future of nanoelectronics. The quantum states in spin textures such as magnetic skyrmions are topologically protected, thus yielding relatively stable and offering exciting new mechanisms for low dissipation information storage. To date, most spin textures being explored are magnetic skyrmions, magnetic vortices and magnetic domain walls in nanostructured materials based on thin film technologies. These 2-dimensional (2D) nanostructures are particularly relevant for device applications because of the ease of miniaturization and integration. In contrast, 3-dimensional (3D) assemblies of nanostructures offer a whole new platform for highly integrated nanoelectronics with enhanced functionalities. They also come with new challenges regarding suitable mechanisms and carriers for information storage in these complex 3D structures. The present disclosure fulfills that need and provides additional benefits over previous technologies.

BRIEF SUMMARY

Currently, exploration of spin textures with topological characters is limited to magnetic skyrmions, vortices and domain walls, that are either patterned in two-dimensional (2D) nanostructures or bulk materials. Topological spin textures in three-dimensions (3D) have not yet been reported, particularly at the micro- and nanoscale regimes.

The technology described in this disclosure takes advantage of the topological character of the 3D patterns themselves. A key challenge is the synthesis of such structures. The disclosed technology both provides practical approaches to realize such structures and offers a procedure to set the magnetic state into the topological state.

More particularly, in some embodiments this disclosure describes directly fabricating 3D topological magnetic structures, and utilizing them for information storage. One example of such topological patterns is found in topological knots such as the Möbius strip. In particular, the present disclosure is referring to topologically non-trivial features, in which if one follows the structure and traces a complete cycle/loop, when returning to the starting point one picks up some change (for example a phase shift or a change in magnetization direction). Knot topology is a mathematical term (e.g., inspired by knots that appear in daily life (e.g., shoelaces)) that differ from these common knots by having ends joined together so that it cannot be undone, the simplest knot being a ring.

A Möbius strip is one such topological knot which utilizes a band in which the faces of the band reverse (e.g., half twist, or odd number of half twists along the path of the strip). The Möbius strip can be envisioned by giving a certain strip a half-twist and then joining the ends of the strip to form a loop. However, in the present disclosure the Möbius strip or other 'knot' (e.g., Trefoil knot and other topological patterns) structure is fabricated to contain magnetic material, so that its magnetic configurations become topologically protected and cannot be destroyed easily. One of the advantages of this promising technology area is that such a pattern can be used for secure information storage because the configuration is robust against tampering. The energy cost for manipulating such configurations could be very low, analogous to that found in 2D magnetic skyrmions where the critical current density for moving them was found to be several orders of magnitude smaller than comparable operations performed in present CMOS technology. Finally having such topological features in 3D assemblies opens up new possibilities for a sophisticated level of integration and functionalities.

In any of these "knots" a spin traversing along the band for a complete cycle will recover its original position, but not necessarily its original orientation. For spins lying in the plane of the band, they will recover the orientation after a full loop; however for a spin perpendicular to the band, its orientation will have changed. It should be noted that in-plane spins would rotate 360 degrees; while perpendicular spins would rotate 180 degrees, while spins pointing at an angle to the band would rotate some other angles. In another general configuration the spin points at an arbitrary angle to the plane of the band, which can be regarded as a super position of the in-plane and perpendicular moments. The spins can respond to an external magnetic field, but can never achieve a ferromagnetic state (with all magnetic moments pointing in the same direction) under continuous transformations due to the topological knot. It will be appreciated that any such "knots" have to be twisted. There could be twisted patterns that are not "knots", for example a band can be twisted in one section and reversed some distance later in another section, without forming a knot. Those "knots" are not interesting in the topological sense, because they can just be undone by untwisting both sections. In regard to the present disclosure, when a knot is formed the topology is locked.

Magnetic Möbius strips can be fabricated by a number of methods, including for example 3D printing or lithography using two-photon polymerization process. Spin configurations along the Möbius band will follow the surface, for example in the plane of the band, perpendicular to the band, or at an angle to it, and thus can display fascinating topological properties, including magnetic vortices and skyrmions.

For example, for a Möbius band with in-plane moments along the band, a spin traversing along the band for a complete cycle will recover its original position and orientation, but will have rotated 360°; the spins can respond to an external magnetic field, but can never achieve a ferromagnetic state (with all magnetic moments pointing in the same direction) due to the topological knot. 3D arrays of such nano-Möbius strips may form a prototype magnetic information storage or memory device with potentially low energy dissipation.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

1. Introduction

Described herein is a new type of topological spin texture in 3D magnetic structures. These may include, but are not limited to, Möbius strips, trefoil knots, and other types of topological patterns that are made of suitable magnetic materials. By way of example and not of limitation the following description will focus on the relatively simpler Möbius strips, but the principles apply to other types of topological features as well.

2. Magnetic Configuration

Figure 1A:
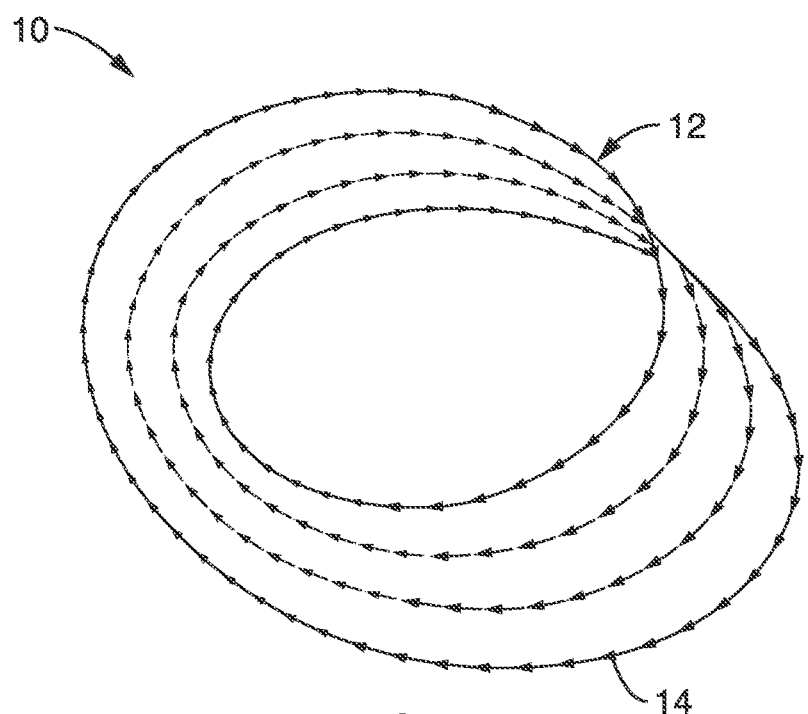
FIG. 1A and FIG. 1B are schematics of a spin texture pattern in a topological knot structure, Möbius band, with magnetic moments lying in the plane of the band or perpendicular to it, respectively, according to an embodiment of the present disclosure.
Figure 1B:
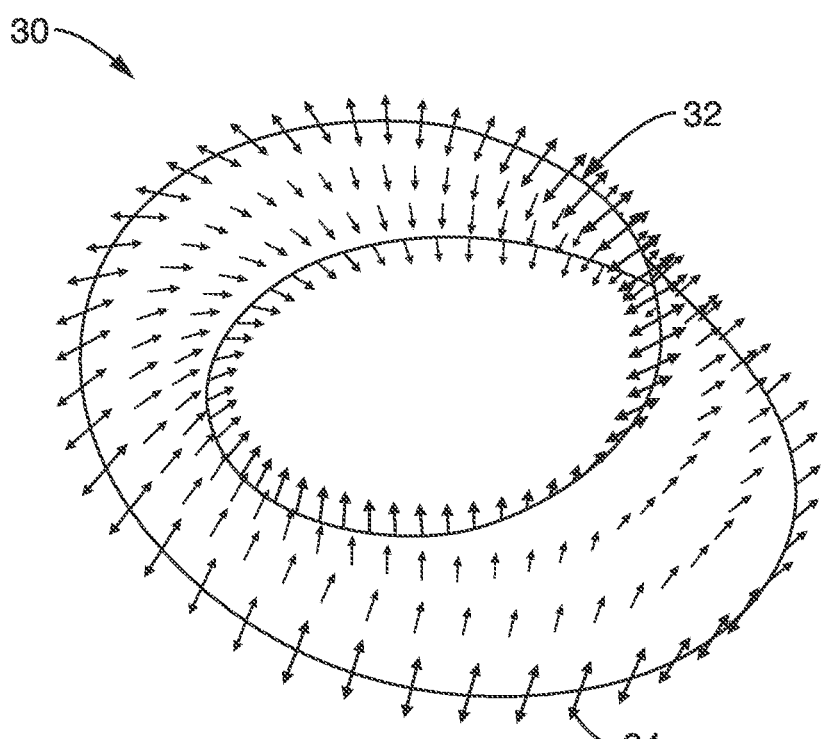

FIG. 1A and FIG. 1B illustrate example embodiments 10, 30 of a Möbius knot structure 12, 32, depicting a band of magnetic material having magnetic moments either lying in the plane of the band 14 or perpendicular 34 to it, respectively. In addition to these depicted configurations, in another general configuration the spins can point at an arbitrary angle to the plane of the band, which can be regarded as a super position of the in-plane and perpendicular moments.

To aid in visualization, an example of a Möbius strip shape can be made by giving a strip a half-twist and then joining the ends of the strip to form a loop.

Spin configurations along the Möbius band will follow the surface, either in-plane or perpendicular to it, and thus could display fascinating topological properties, including magnetic vortices, domain walls and skyrmions. The realization of a topological magnetic state can be regarded as "1", and its absence can be regarded as "0" (or vice-versa), for information storage, or magnetic memory or logic applications. It should be appreciated that the in-plane and perpendicular configurations are used differently, depending on the materials utilized to fabricate them, or depending on the band that is magnetized. In regard to number of bits of storage, in simplest form, a single "knot" in a single Mobius band, can provide for 1 bit of storage. One can introduce different types of twists along the band, wherein it is possible to retain multiple bits along the band. For example, for a Möbius band with in-plane moments along the band as shown in FIG. 1A, a spin traversing along the band for a complete cycle will recover its original position and orientation, but have rotated 360°; the spins can respond to an external magnetic field, but cannot achieve a ferromagnetic state under continuous transformation, where all magnetic moments pointing in the same direction, due to the topological knot. Such a configuration, along with the magnetic singularity, may be used for information storage with extreme stability against tampering and low energy cost.

3. Fabrication of the 3D Topological Pattern

In some embodiments, the 3D topological pattern will be designed and realized by a number of 3D fabrication options:

3.1 The topological pattern, such as Möbius strips and trefoil knots, may be designed with a variety of dimensions, ranging from atomic scale to macroscopic sizes.

3.2 In one embodiment, lithography with a two-photon polymerization process may be utilized.

3.2.1 The topological pattern may be fabricated as a mold in a (polymer) matrix, either as a positive or negative copy of the desirable topological pattern.

3.2.2 For a negative copy of the pattern, which is a void in the matrix, metallic and magnetic components (e.g., Co, Ni, Fe) can be injected into the void to realize the topological feature.

3.2.3 The injection may be achieved by electroless plating, electrodeposition, atomic layer deposition, and pressure injection, etc.

3.2.4 For a positive copy of the pattern, polymers containing magnetic species can be used to form such bands directly.

3.2.5 Alternatively, a number of techniques may be used to coat a magnetic layer over a positive copy of the pattern, as examples but not limited to, by sputtering, evaporation, electrodeposition, atomic layer deposition, spray painting, and so forth.

3.2.6 The formed topological patterns may undergo further treatment, for example under heat, light exposure, temperature cycling, mechanical strengthening, or other known techniques.

3.3 In another embodiment, 3D printing may be used to directly define the topological pattern, with similar steps taken as outlined above for further processing the pattern.

3.4 The magnetic coating may take the form of a single layer or a multilayer film, with its magnetization direction orientated in the desired direction, for example in the plane of a Möbius strip or perpendicular to it.

3.5 Usually in magnetic films, the magnetization direction lies in the plane of the film due to the demagnetization effect. In certain systems, however, the magnetization direction actually prefers to be normal to the film plane, due to interfacial anisotropy or crystalline anisotropy, such as Co/Pt, Co/Pd, Fe/Gd, and ultrathin Co and Ni films.

4. Recording the Magnetic State

The magnetic state of the topological pattern will be history dependent. To set a topological magnetic state, the structure can be exposed to a magnetic field in a sequential manner, so as to magnetize it section by section in the desired direction. In at least one embodiment the structure is heated by a laser beam locally above the magnetic ordering temperature, known as the Curie temperature, followed by exposing that particular section in a magnetic field. During the cooling down, that section becomes magnetically ordered, and follows the magnetic field direction. This process is then repeated along the structure to completely set the entire pattern into the desired topological configuration. Depending on the pattern to be recorded, the magnetic field direction and strength could be either constant or spatially varying, synchronized with the heating spot on the Möbius band.

Therefore recording/magnetizing can be performed in a manner similar to how data is saved on a hard disk drive, by magnetizing one region on the track(band) at a time. The example above is somewhat similar to a concept known as heat-assisted magnetic recording (HAMR): for ultrahigh density recording, the bits in the media are extremely small. The material is very stable at room temperature—magnetically "hard". So they cannot be easily written at room temperature using the write head in a hard drive. To perform a write the structure is heated up a small section at a time; at high temperature the media is magnetically "soft" and can be magnetized in a finite magnetic field. When that section cools down, the information is written and stable. The HAMR is a new technology that is being introduced by the magnetic recording industry.

Magnetic states of these structures are expected to be topologically protected once they are created. 3D assemblies of such structures, for example, nano-Möbius strips in separate arrays or interconnected networks, may form a magnetic information storage device with potentially low energy dissipation.

5. Sensing the Magnetic State

Once the topological state is set, sensing may be achieved in a number of ways, such as using magnetoresistive devices, magneto-optical readouts, magnetostrictive effects, magnetic force originated from the spin texture, spin or charge currents, and so forth. It will be appreciated that the spin Seebeck effect refers to the generation of a spin voltage in response to a temperature gradient in a ferromagnet, which enables the thermal injection of spin currents from the ferromagnet into an attached nonmagnetic metal over a macroscopic scale of several millimeters.

6. Method Embodiment

Figure 2:
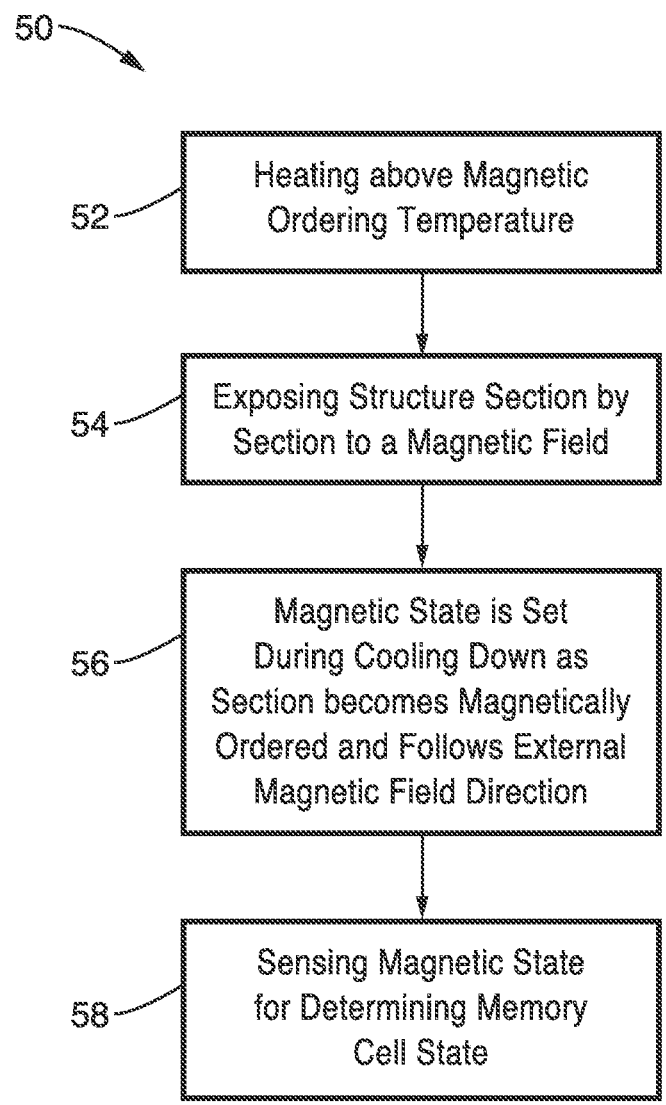
FIG. 2 is a flow diagram of setting and reading a spin texture pattern from a topological knot structure according to an embodiment of the present disclosure.

FIG. 2 illustrates an example embodiment 50 of a method for setting a state for the topological magnetic structure and then reading its state. At block 52 the structure is heated above the magnetic ordering temperature, such as section by section as it is exposed to magnetic fields. Then the structure is exposed section-by-section 54 to a magnetic field, and the magnetic field is set 56 during cool down as the section becomes magnetically ordered and follows the magnetic field direction. In block 58 the magnetic state can be read out for applications for information storage or memory applications.

7. General Scope of Embodiments

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general-purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple embodiments which include, but are not limited to, the following:

1. A method of forming 3-dimensional magnetic structures with topological spin textures, the method comprising: (a) forming a three-dimensional structure with a selected topological pattern into a patterned three-dimensional structure; and (b) configuring a topological magnetic state of the patterned three-dimensional structure in response to exposing the patterned three-dimensional structure, section-by-section, to a magnetic field, whereby the magnetic state is set into a desired direction, wherein the magnetic state can be measured subsequently as a read-out of topological magnetic state for use in information storage, magnetic memory or logic devices.

2. The method or apparatus of any preceding or following embodiment, wherein said configuring the topological state of the patterned three-dimensional structure further comprises heating above a magnetic ordering temperature when exposing the patterned three-dimensional structure section-by-section to a magnetic field.

3. The method or apparatus of any preceding or following embodiment, wherein said three-dimensional structure is formed with a process comprising: (a) forming a void of a negative copy of the selected topological pattern in a mold; (b) injecting metallic and magnetic components into the void of the mold; and (c) releasing a molded structure, having the selected topological pattern, from the mold.

4. The method or apparatus of any preceding or following embodiment, wherein said injection of metallic and magnetic components into the void of the mold is performed with a process selected from a group of processes consisting of electroless plating, electrodeposition, and pressure injection.

5. The method or apparatus of any preceding or following embodiment, wherein said injection of metallic and magnetic components into the void of the mold is performed with an atomic layer deposition process.

6. The method or apparatus of any preceding or following embodiment, wherein said three-dimensional structure comprises a Möbius strip, or a trefoil knot, topological pattern with a variety of dimensions, ranging from atomic scale to macroscopic sizes.

7. The method or apparatus of any preceding or following embodiment, wherein said three-dimensional structure is formed with a process comprising: (a) forming a positive copy of a base three-dimensional structure with the selected topological pattern; and (b) coating the base three-dimensional structure with at least one coating of a magnetic material.

8. The method or apparatus of any preceding or following embodiment, wherein said coating the base three-dimensional structure with at least one coating of a magnetic material is performed with a process selected from a group of processes consisting of sputtering, evaporation, electrochemical deposition, and spray painting.

9. The method or apparatus of any preceding or following embodiment, wherein said coating the base three-dimensional structure with at least one coating of a magnetic material is performed with a process of atomic layer deposition.

10. The method or apparatus of any preceding or following embodiment, further comprising treating the patterned three-dimensional structure with a treatment selected from a group of treatments consisting of heat treatment, light exposure, temperature cycling, and mechanical strengthening.

11. The method or apparatus of any preceding or following embodiment, further comprising sensing topological magnetic state of the configured three-dimensional structure with a sensor.

12. The method or apparatus of any preceding or following embodiment, further comprising forming an array of the patterned three-dimensional structures whose topological magnetic states can be read-out for information storage, magnetic memory or logic devices.

13. An apparatus for information storage, magnetic memory, or logic devices, comprising: (a) a three-dimensional topological knot structure comprising a band having one half twist, or an odd number of half twists, with ends of the band which are joined together; (b) wherein said three-dimensional topological knot structure incorporates at least one magnetic material; (c) a magnetic state which can be induced into said three-dimensional topological knot structure to have a magnetic pattern which can vary section-by-section giving said three-dimensional topological knot structure a topological magnetic state; (d) wherein said odd number of half twists along said band is configured to cause magnetic spins that traverse said band for a complete cycle to recover their original position, yet with a finite rotation, so that the magnetic spins can respond to an external magnetic field without achieving a ferromagnetic state, having all magnetic moments pointing in the same direction, under continuous transformations; and (e) whereby the topological magnetic state of said three-dimensional topological knot structure can be read-out for information storage, magnetic memory or logic devices.

14. The method or apparatus of any preceding or following embodiment, wherein said magnetic state is induced while heating said three-dimensional topological knot structure above a magnetic ordering temperature.

15. The method or apparatus of any preceding or following embodiment, wherein the topological magnetic state can be regarded as a "1" state and its absence can be regarded as a "0" state, or conversely the topological magnetic state can be regarded as a "0" state and its absence can be regarded as a "1" state, for use in information storage, magnetic memory, or logic applications.

16. The method or apparatus of any preceding or following embodiment, wherein the topological magnetic state of said three-dimensional topological knot structure can be read-out using a sensor selected from a group of sensors consisting of magnetoresistive devices, magneto-optical readout devices, magnetostrictive effects sensors, sensors using magnetic forces originating from spin textures, spin current sensors, and spin Seebeck effect sensors.

17. The method or apparatus of any preceding or following embodiment, wherein said half twist, or said odd number of half twists, result in faces of the band reversing as the band is traversed.

18. The method or apparatus of any preceding or following embodiment, wherein said three-dimensional topological knot structure comprises a Möbius strip, or a trefoil knot.

19. The method or apparatus of any preceding or following embodiment, wherein the magnetic spins follow either in-plane or perpendicular to the band of said three-dimensional topological knot structure.

20. The method or apparatus of any preceding or following embodiment, wherein the magnetic spins follow in-plane, perpendicular, or at an angle, to the band of said three-dimensional topological knot structure.

21. The method or apparatus of any preceding or following embodiment, wherein the magnetic spins following said three-dimensional topological knot exhibits topological properties comprising magnetic vortices, skyrmions, or a combination of magnetic vortices and skyrmions.

22. The method or apparatus of any preceding or following embodiment, wherein said three-dimensional topological knot structure has dimensions which can range from an atomic scale to macroscopic sizes.

23. The method or apparatus of any preceding or following embodiment, wherein said three-dimensional topological knot structure is configured for forming into a 3-dimensional array of three-dimensional topological knot structures which can be read-out for information storage, magnetic memory or logic devices.

24. A method for forming 3-dimensional magnetic structures with topological spin textures, the method comprising: (a) forming a three-dimensional structure with a selected topological pattern; and (b) configuring a magnetic state of the patterned three-dimensional structure.

25. The method or apparatus of any preceding or following embodiment, wherein said three-dimensional structure comprises a Möbius strip or a trefoil knot topological pattern with a variety of dimensions, ranging from atomic scale to macroscopic sizes.

26. The method or apparatus of any preceding or following embodiment, wherein said three-dimensional structure is formed with a process comprising: forming a void of a negative copy of a selected topological pattern in a mold in a polymer matrix; injecting metallic and magnetic components into the void of the mold; and releasing the molded structure from the mold.

27. The method or apparatus of any preceding or following embodiment, wherein said injection of metallic and magnetic components into the void of the mild is performed with a process selected from the group of electroless plating, electrodeposition, atomic layer deposition, and pressure injection.

28. The method or apparatus of any preceding or following embodiment, wherein said three-dimensional structure is formed with a process comprising: forming a positive copy of a base three-dimensional structure with a selected topological pattern; and coating the base structure with one or more coatings of a magnetic material.

29. The method or apparatus of any preceding or following embodiment, wherein said coating of magnetic material is performed with a process selected from the group of sputtering, evaporation, electrodeposition, atomic layer deposition, and spray painting.

30. The method or apparatus of any preceding or following embodiment, further comprising treating the patterned three-dimensional structure with a treatment selected from the group of treatments consisting of heat treatment, light exposure, temperature cycling, and mechanical strengthening.

31. The method or apparatus of any preceding or following embodiment, further comprising verifying the configured topological magnetic state of the configured three-dimensional structure with a sensor.

32. The method or apparatus of any preceding or following embodiment, wherein said sensor senses a magnetic state with a sensor selected from the group of sensors consisting of a magnetoresistive device, a magneto-optical readout device, a magnetostrictive effects sensor, a magnetic force originating from the spin texture sensor, a spin current sensor, and a spin Seebeck effect sensor.

33. The method or apparatus of any preceding or following embodiment, further comprising forming an array of 3-dimensional magnetic structures with topological spin textures.

34. Each and every embodiment of the technology described herein, as well as any aspect, component, or element of any embodiment described herein, and any combination of aspects, components or elements of any embodiment described herein.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method of forming a three-dimensional magnetic structure with a topological spin texture, the method comprising:
   (a) forming a three-dimensional structure with a selected topological pattern into a patterned three-dimensional structure; and
   (b) configuring a topological magnetic state of the patterned three-dimensional structure by exposing the patterned three-dimensional structure to a magnetic field, section-by-section, whereby the magnetic state is set into a desired direction, wherein the magnetic state can be measured subsequently as a read-out of topological magnetic state for use in information storage, magnetic memory or logic devices.

2. The method of claim 1, wherein said configuring the topological magnetic state of the patterned three-dimensional structure comprises heating above a magnetic ordering temperature when exposing the patterned three-dimensional structure section-by-section to a magnetic field.

3. The method of claim 1, wherein said three-dimensional structure is formed by:
   (a) forming a void of a negative copy of the selected topological pattern in a mold;
   (b) injecting metallic and magnetic components into the void of the mold; and
   (c) releasing a molded structure having the selected topological pattern from the mold.

4. The method of claim 3, wherein said injection of metallic and magnetic components into the void of the mold is performed with a process selected from a group of processes consisting of electroless plating, electrodeposition, and pressure injection.

5. The method of claim 3, wherein said injection of metallic and magnetic components into the void of the mold is performed with an atomic layer deposition process.

6. The method of claim 1, wherein said three-dimensional structure comprises a Möbius strip or a trefoil knot topological pattern.

7. The method of claim 1, wherein said three-dimensional structure is formed by:
   (a) forming a positive copy of a base three-dimensional structure with the selected topological pattern; and
   (b) coating the base three-dimensional structure with at least one coating of a magnetic material.

8. The method of claim 7, wherein said coating the base three-dimensional structure with at least one coating of a magnetic material is performed with a process selected from a group of processes consisting of sputtering, evaporation, electrochemical deposition, and spray painting.

9. The method of claim 7, wherein said coating the base three-dimensional structure with at least one coating of a magnetic material is performed with a process of atomic layer deposition.

10. The method of claim 1, further comprising treating the patterned three-dimensional structure with a treatment selected from a group of treatments consisting of heat treatment, light exposure, temperature cycling, and mechanical strengthening.

11. The method of claim 1, further comprising sensing topological magnetic state of the configured three-dimensional structure with a sensor.

12. The method of claim 1, further comprising forming an array of the patterned three-dimensional structures whose topological magnetic states can be read-out for information storage, magnetic memory or logic devices.

13. The method of claim 1, wherein the three-dimensional structure comprises a band having an odd number of half twists, with ends of the band joined together.

14. The method of claim 13, wherein said odd number of half twists along said band causes magnetic spins that traverse said band for a complete cycle to recover their original position, yet with a finite rotation, so that the magnetic spins can respond to an external magnetic field without achieving a ferromagnetic state, having all magnetic moments pointing in the same direction, under continuous transformations.

15. The method of claim 14, wherein the magnetic spins follow either in-plane or perpendicular to the band.

16. The method of claim 14, wherein the magnetic spins follow in-plane, perpendicular, or at an angle, to the band.

17. The method of claim 14, wherein the magnetic spins exhibit topological properties comprising magnetic vortices, skyrmions, or a combination of magnetic vortices and skyrmions.

18. The method of claim 1, wherein the topological magnetic state can be regarded as a "1" state and its absence can be regarded as a "0" state, or conversely the topological magnetic state can be regarded as a "0" state and its absence can be regarded as a "1" state, for use in information storage, magnetic memory, and/or logic applications.

19. The method of claim 1, further comprising:
   reading the topological magnetic state of the patterned three-dimensional structure using a sensor selected from a group of sensors consisting of magnetoresistive devices, magneto-optical readout devices, magnetostrictive effects sensors, sensors using magnetic forces originating from spin textures, spin current sensors, and spin Seebeck effect sensors.

* * * * *